(12) United States Patent
Holder et al.

(10) Patent No.: US 6,284,040 B1
(45) Date of Patent: Sep. 4, 2001

(54) PROCESS OF STACKING AND MELTING POLYCRYSTALLINE SILICON FOR HIGH QUALITY SINGLE CRYSTAL PRODUCTION

(75) Inventors: John D. Holder, Lake St. Louis; Hariprasad Sreedharamurthy, Ballwin, both of MO (US)

(73) Assignee: MEMC Electronic Materials, Inc., St. Peters, MO (US)

(*) Notice: Subject to any disclaimer, the term of this patent is extended or adjusted under 35 U.S.C. 154(b) by 0 days.

(21) Appl. No.: 09/229,540

(22) Filed: Jan. 13, 1999

(51) Int. Cl.$^7$ .................................................. C30B 15/00
(52) U.S. Cl. .................................................................. 117/13
(58) Field of Search ......................................... 117/4, 13, 11

(56) References Cited

U.S. PATENT DOCUMENTS

| | | | |
|---|---|---|---|
| 4,249,988 | * | 2/1981 | Lavigna et al. ..................... 156/605 |
| 5,037,503 | * | 8/1991 | Kajimoto et al. ................. 156/620.1 |
| 5,242,531 | * | 9/1993 | Klingshirn et al. .............. 156/620.4 |
| 5,340,434 | * | 8/1994 | Takano et al. ........................ 117/21 |
| 5,415,125 | * | 5/1995 | Fujita et al. .......................... 117/17 |
| 5,588,993 | * | 12/1996 | Holder ................................... 117/13 |
| 5,846,318 | * | 12/1998 | Javidi .................................... 117/14 |
| 5,919,303 | * | 7/1999 | Holder ................................... 117/13 |
| 5,932,002 | * | 8/1999 | Izumi ..................................... 117/13 |

FOREIGN PATENT DOCUMENTS 0 787 836 A2    8/1997   (EP).

* cited by examiner

Primary Examiner—Benjamin L. Utech
Assistant Examiner—Matthew Anderson
(74) Attorney, Agent, or Firm—Senniger, Powers, Leavitt & Roedel

(57) ABSTRACT

An improved process for forming a single crystal silicon ingot from solid, varying sized chunks of polycrystalline silicon source material according to the Czochralski method. The process includes classifying each chunk of source material by size, placing chunks of source material into a crucible to form a stack in the crucible. The chunks are generally placed within at least three regions of the crucible that are pre-selected according to the size classifications of the chunks. The stack within the crucible is melted in an inert environment at an elevated temperature to form a source melt, and the temperature of the crucible and the source melt is stabilized to an equilibrium level suitable for crystal growth. The single crystal silicon ingot is pulled from the source melt according to the Czochralski method. In another aspect, the step of melting the stack is taken while the crucible has an ambient pressure that is greater than an ambient pressure when the step of stabilizing the temperature is taken.

16 Claims, 3 Drawing Sheets

PROCESS OF STACKING AND MELTING POLYCRYSTALLINE SILICON FOR HIGH QUALITY SINGLE CRYSTAL PRODUCTION

BACKGROUND OF THE INVENTION

This invention relates generally to the production of single crystal silicon ingots, and in particular to a method for stacking and melting chunks of polycrystalline silicon source material in a crucible as part of the Czochralski method to produce crystal ingots of improved quality.

Most semiconductor chips used in electronic devices are fabricated from single crystal silicon prepared by the Czochralski process. In that process, a single crystal silicon ingot is produced by melting polycrystalline silicon source material stacked within a quartz crucible, stabilizing the crucible and source melt at an equilibrium temperature, dipping a seed crystal into the source melt, withdrawing the seed crystal as the source melt crystallizes on the seed to form a single crystal ingot, and pulling the ingot as it grows. Melting occurs at temperatures higher than 1420° C., in an inert gas environment at low pressure. The crucible is continually rotated about a generally vertical axis as the crystal grows. The rate at which the ingot is pulled from the source melt is selected to form an ingot having a desired diameter.

A substantial concern in the production of single crystal ingots by the Czochralski process is the need to prevent formation of dislocations, voids, or other defects in a crystal lattice structure. Dislocations can be generated by one or more of a variety of possible causes, including thermal shocks, vibrations or mechanical shocks, internal strain due to regional cooling rate differences, solid particles in the melt at the crystal growth interface, gas bubbles trapped within the melt, and surface tension effects. Once generated, dislocations degrade the uniformity of electrical characteristics and permit the attachment of impurities. Voids or air pockets within the crystal similarly disrupt continuity of the material.

Further aggravating the problem is that any localized defect or dislocation in the crystal spreads widely and usually renders the product unusable. If a first dislocation forms in the crystal structure, it multiplies and generates numerous dislocations which spread out into the crystal. Therefore, if a dislocation-free growing crystal is disturbed at one point, the whole cross section and a considerable part of the already grown crystal may be inundated with dislocations. Thus it is crucial to maintain the growing crystal in a completely dislocation-free state. Otherwise, production yield and throughput will be substantially degraded.

The initial stacking, or charging, of polycrystalline silicon source material into a crucible and the melting thereof must be done carefully, or the crystal will be ruined. The typical ways that defects are inadvertently introduced during charging and melt-down are through damage to the crucible, splashing of molten silicon, and trapping of gas pockets.

Damage to the crucible occurs when solid silicon strikes or scratches a wall. Crucibles have walls lined with quartz that minimize reaction with the molten silicon bath and thereby avoid the introduction of impurities. Polycrystalline silicon source material is usually supplied in irregularly shaped chunks of varying size having edges that may be smooth, blunt, or sharp. When the crucible is initially charged with chunk polycrystalline silicon, sharp or pointed edges can gouge the quartz walls. When the crucible is fully charged, the weight of the load rests on the chunks along the bottom walls, which can scratch and nick the walls, especially when the chunks are moved or shift under load. Particles of quartz typically flake off or break off from damaged crucible walls and fall into the silicon source material. These particles become fused silica impurities that float on the silicon melt or attach to the liquid/solid crystal growth interface, significantly increasing the likelihood of a dislocation forming within the crystal.

As melting proceeds, splashing may occur. Chunks along the bottom melt first, and subsequently chunks above shift or fall into the melt. If the heat distribution in the crucible is not uniform, the lower portion of the chunk-polycrystalline silicon can melt away and leave either a "hanger" of unmelted material stuck to the crucible wall above the melt or a "bridge" of unmelted material bridging between opposing sides of the crucible wall over the melt. When the charge shifts or a hanger or bridge collapses, it may splatter molten silicon on the crucible walls above the surface of the melt. Thermal shock to splattered regions damages the crucible, leading to subsequent contamination of the source melt with quartz particles and dislocations in the crystal ingot.

The way the crucible is charged with polycrystalline silicon chunks may also lead to trapping gas pockets in the melt, another source of crystal defects. As melting progresses molten silicon flows from the edges toward the bottom center of the crucible, gradually filling the crucible with liquid. Ideally, the gas between chunks in the crucible, which is typically an inert gas such as argon, is merely displaced by the liquid and stays above the liquid surface of the melt. However, when a relatively large or flat chunk of solid silicon is located adjacent the bottom of the crucible, oriented generally parallel the bottom so that a flat side of the chunk does not conform to the curved bottom surface of the crucible but rather is spaced from the surface, pockets of gas can be trapped beneath the chunk as melting proceeds. Chunks or particles of solid silicon that are very small can aggravate the problem by creating void space beneath or between other chunks in which gas bubbles become trapped. Further, small chunks are slow to melt because they have greater relative surface area. Although sometimes gas pockets rise to the top surface of the source melt and are expelled at some point during the melt-down, often they stay in the melt, later becoming voids or air pockets within the single crystal ingot.

Another factor contributing to the creation of trapped gas pockets is the equal relative ambient pressures at which melting and stabilization proceed. Typically in the Czochralski process, the steps of melting the silicon and stabilizing to a thermal equilibrium temperature occur at close to the same ambient pressures; typical levels being 23 Torr absolute (standard sea level atmospheric pressure is 760 Torr). However, this equal-pressure practice has a drawback in that any bubbles of argon gas that become trapped within the source melt during melt-down have no relative pressure impetus during stabilization to expand or move to the surface of the melt for release. Bubbles in the source melt, both those along the bottom walls and those that are suspended within the melt, remain at a pressure equal to the ambient gas above the source melt, and are urged to the surface only by natural buoyancy. Because the source melt is viscous, buoyancy may be insufficient to draw many bubbles to the surface of the melt for expulsion. Gas bubbles remain in the melt, and these bubbles often attach at the crystal growth interface where they cause the formation of voids.

SUMMARY OF THE INVENTION

Among the several objects and features of the present invention may be noted the provision of an improved process for forming a single crystal silicon ingot from solid, varying sized chunks of polycrystalline silicon source material according to the Czochralski method; the provision of such a process with zero dislocation crystal growth and improved throughput; the provision of such a process that helps prevent formation of crystal dislocations and air pockets in the ingot; the provision of such a process that inhibits damage to a crucible when the melt is formed; the provision of such a process which promotes more uniform melting and inhibits splashing in the melt; the provision of such a process that minimizes trapping of gas bubbles in the melt; and the provision of such a process that is economical in operation.

In general, a process of the present invention for forming a single crystal silicon ingot from solid, varying sized chunks of polycrystalline silicon source material according to the Czochralski method comprises classifying each chunk of source material by size and placing chunks of source material into a crucible to form a stack in the crucible. The chunks are generally placed within at least three regions of the crucible that are pre-selected according to the size classifications of the chunks. The stack is melted within the crucible in an inert environment at an elevated temperature to form a source melt, and then the temperature of the crucible and the source melt are stabilized to an equilibrium level suitable for crystal growth. The single crystal silicon ingot is pulled from the source melt according to the Czochralski method.

In another aspect, a process of the present invention for forming a single crystal silicon ingot comprises taking the step of melting the stack of source material while the crucible has an ambient pressure that is greater than an ambient pressure when the step of stabilizing the temperature is taken.

Other objects and features of the present invention will be in part apparent and in part pointed out hereinafter.

BRIEF DESCRIPTION OF THE DRAWINGS

Corresponding reference characters indicate corresponding parts throughout the views of the drawings.

DETAILED DESCRIPTION OF THE PREFERRED EMBODIMENT

Figure 2:
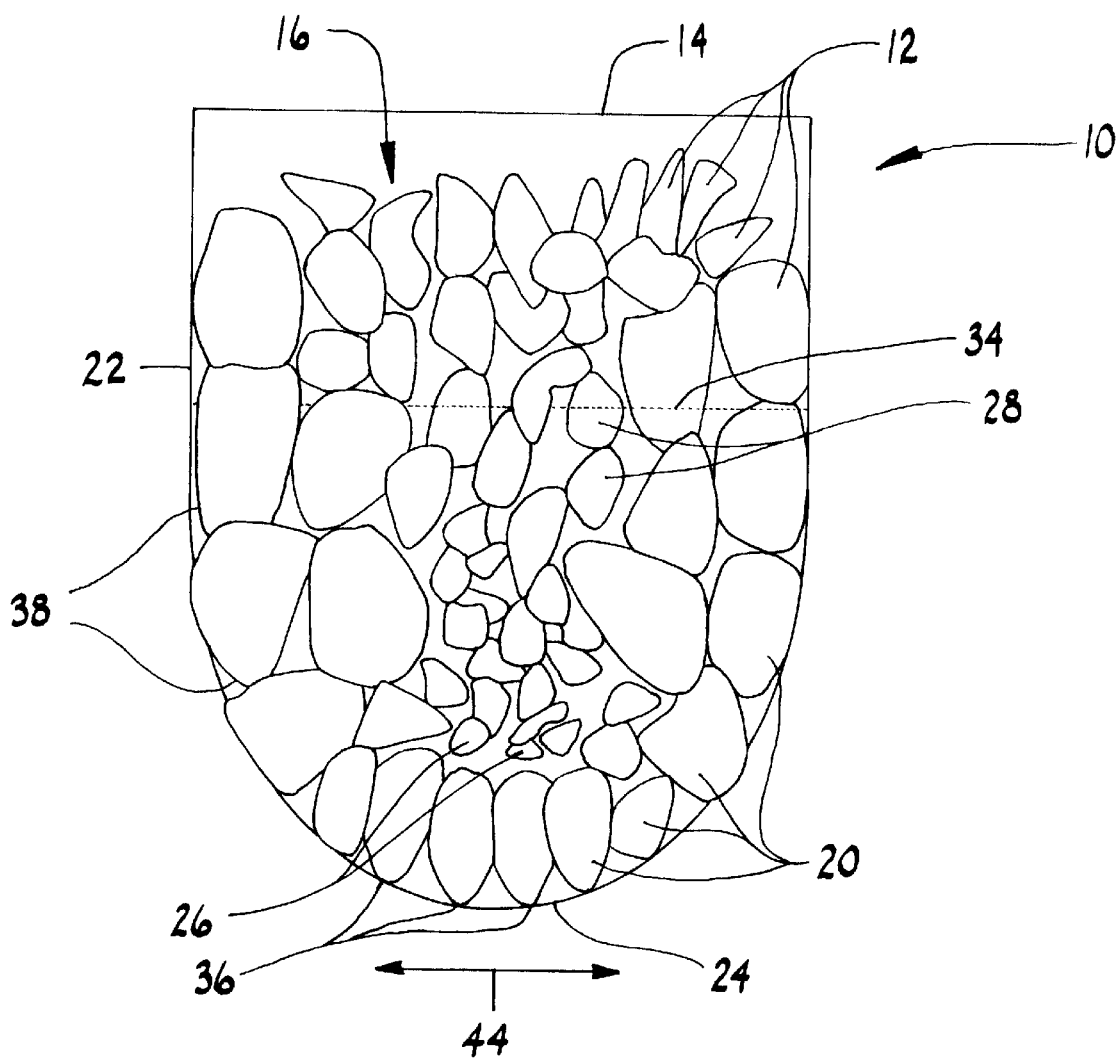
FIG. 2 is a sectional view of a charged crucible, the chunks having an arrangement and orientation made according to the process of the present invention.

Referring now to the drawings and in particular to FIG. 2, a crucible containing varying sized chunks 12 of polycrystalline silicon source material arranged and oriented according to the process of the present invention is indicated generally at 10. The polycrystalline chunks 12 of source material are placed within a quartz crucible 14 to form a stack 16 in the crucible at the beginning of the Czochralski process. The systematic selection of location and orientation of the chunks 12 within the crucible 14 is one key to the process of the present invention, as will be described below.

Polycrystalline silicon source material used in the Czochralski process for making monocrystal silicon ingots is provided from suppliers generally in chunks 12 of differing sizes and shapes. Source material is typically a high purity silicon produced by suppliers using a Siemen's process. In that process, solid polycrystalline silicon rods, or logs, are made by a pyrolytic decomposition of a gaseous silicon compound, such as silane or a chlorosilane, on a rod-shaped, heated starter filament. The product logs, which may be as large as six feet long and three feet in diameter, are manually broken up using hammers into chunks 12 for shipment to users in sealed bags. The chunks 12 typically have a wide variety of sizes and shapes, ranging from 2 to 125 millimeters in a largest dimension, up to 650 grams in mass, and can have edges that are randomly blunt, sharp, or pointed.

Figure 1:
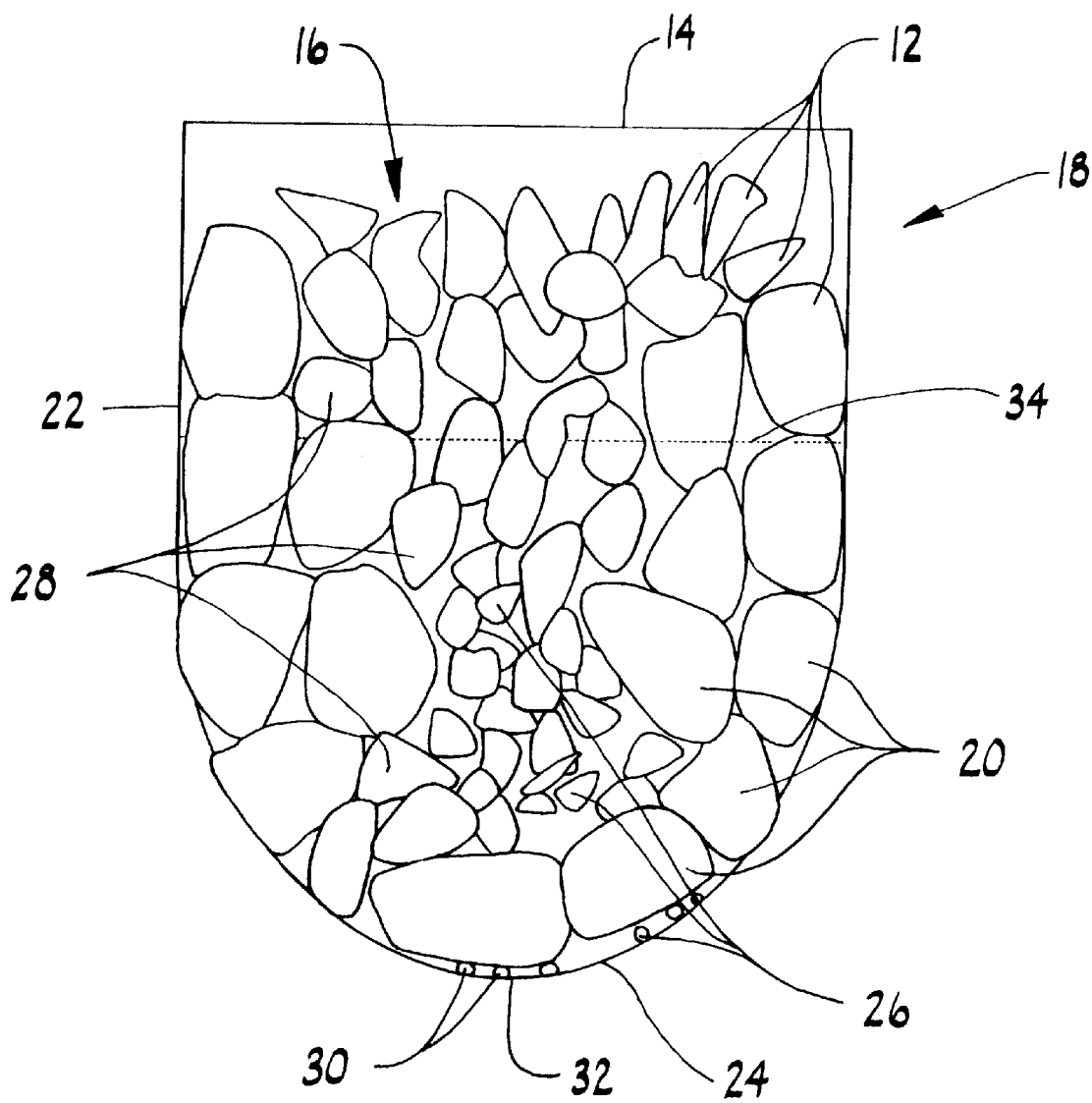
FIG. 1 is a sectional view of a crucible charged with varying sized chunks of polycrystalline silicon source material, the chunks arranged in a manner typical of that seen in practice of the prior art.

Referring now to FIG. 1, a crucible having chunks 12 arranged in one manner typical of that seen in practice of the prior art is indicated generally at 18. The arrangement is somewhat random as there has been no systematic stacking plan or arrangement. However, practitioners often place large chunks 20 along the side walls 22 and bottom 24 of the crucible 14 as seen in FIG. 1, with small chunks 26 and medium sized chunks 28 randomly filling the remaining regions of the crucible. All variety of sizes of chunks 12, including finely-sized chunks 30, the very smallest, are included to be put in the crucible 14. In addition, there is no specific orientation given to any chunks based upon shape or edge sharpness.

The practice in the prior art of generally random stacking as in FIG. 1 can lead to formation of crystal dislocations. Upon stacking, sharp-edged or pointed chunks placed adjacent to quartz crucible side walls 22 or bottom 24 can easily damage the crucible 14. Further scratching or gouging can occur if the load of chunks shifts during melt-down, dragging any sharp edges or points against the quartz side walls 22 or bottom 24. As the silicon melts, liquid flows to a bottom center 32 of the crucible 14. The orientation of the large chunks 20 being generally flat along the bottom leaves gaps between the flat bottoms of chunks and the curved bottom 24 of the crucible 14 since the chunk does not conform to the contour of the crucible. The gaps facilitate the trapping of argon gas that is beneath the large chunks as the liquid rises. Further, the smallest, fine chunks 30 of silicon are slow to melt and may become lodged between adjacent chunks, creating gaps that are occupied by argon gas and that may eventually become voids in the crystal. Hangers of unmelted material or bridges between opposing sides of the crucible 14 may form because the random arrangement of chunks 12 can result in uneven heat distribution during melting, potentially causing splashes when the hanger or bridge breaks and falls into the melt.

In contrast, the crucible 10 charged according to the process of the present invention in FIG. 2 inhibits splashing, crucible damage, and trapped gas.

The chunks 12 of polycrystalline silicon source material are first classified by size. There are four size categories: large, medium, small, and fine. Large chunks 20 are characterized by being approximately 88 to 125 mm in largest dimension. Medium chunks 28 range from 50 to 88 mm in largest dimension, and small chunks 26 from 6 to 50 mm in largest dimension. Fine chunks 30 include small particles of silicon and are less than 6 mm in largest dimension. Classifications are made by dimensional measurement of each chunk manually, or by a computer system having an image analyzer capability to analyze two-dimensional images of chunks.

All chunks and particles classified as "fine" size 30 are discarded. As mentioned, finely sized chunks and particles 30 create gaps between other chunks and between other chunks and crucible walls into which gas may be trapped. In addition, fine chunks 30 are more difficult to melt than larger chunks, and require greater expenditures of energy.

Next, chunks 12 of source material are placed into the crucible 14 to form a stack 16. The chunks 12 are placed within regions of the crucible that are pre-selected according to the size classifications of the chunks. An arrangement is defined that provides a generally uniform heat distribution and steady melt-down flow characteristics to avoid crucible damage or splashes.

A first region including the bottom 24 and side walls 22 of the crucible 14 is lined with large chunks 20. At these locations, the large chunks 20 will be the first chunks to begin melting and will not be in a position where they might fall into the melt creating a splash. Small chunks 26 are laid generally in a second region located in a middle portion of the crucible 14 above the large chunks 20, because that location receives the heat energy needed to melt small chunks substantially as quickly as the large and medium chunks. Medium chunks 28 are placed generally in a third region located in the middle above the small chunks 26 and between the large chunks 20 lining the walls. If there are more medium sized chunks 28 than will fit in the space of the region, then additional medium chunks may be placed near the crucible side walls 22 on top, above the large chunks 20, above a calculated melt-line 34 of the charge. The medium chunks 28 on top are oriented with smaller, more narrow or pointed sides toward the crucible side walls 22, but not touching the walls. As the chunks beneath them melt, the medium chunks 28 will therefore fall into the melt more gently, towards their heavier sides opposite the narrower pointed sides, and the chunks will not contact or stick to crucible side walls 22.

Figure 3:
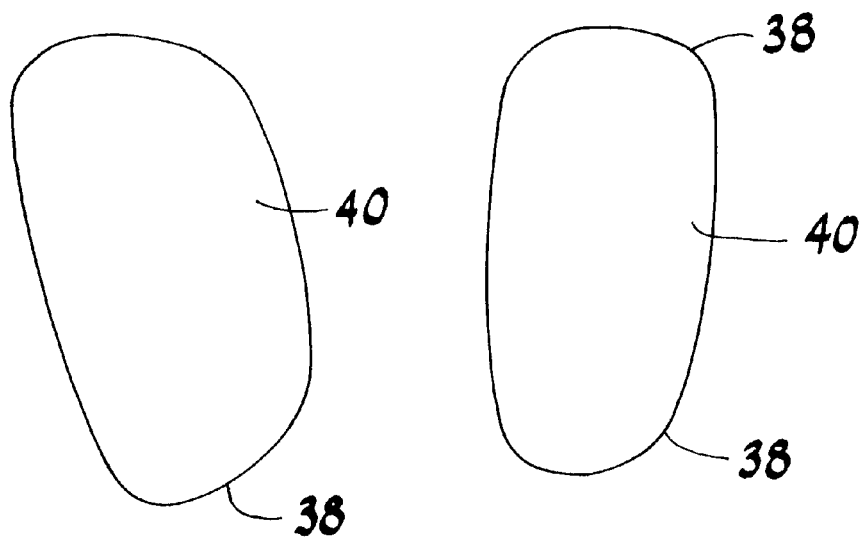
FIG. 3 is an elevational view of two chunks having shapes with round edges.
Figure 4:
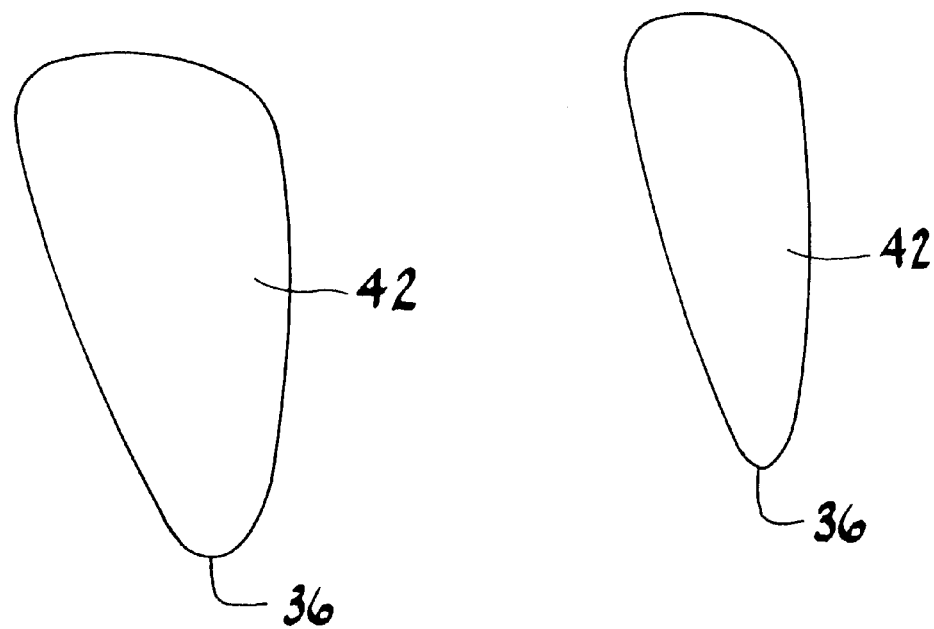
FIG. 4 is an elevational view of two chunks having shapes with blunt points.

Some of the chunks 12 are placed within regions of the crucible 14 that are pre-selected according to both the size classification and a classification according to an edge shape of the chunk. Specifically, the bottom 24 of the crucible 14 is lined with large chunks 20 having generally blunt points 36, while the side walls 22 of the crucible are lined with large chunks 20 having generally round edges 38. Shape classifications are made visually. Referring now to FIG. 3, round edges 38 on chunks 40 are generally cylindrically curved shapes having relatively large radii of curvature as compared to the overall sizes of the chunks. Referring to FIG. 4, blunt points 36 on chunks 42 are generally characterized as truncated triangular prism shapes. Classifications require a judgment as to whether a chunk's shape is more nearly approximated by a truncated rectangular prism, like the blunt points 36 of chunks 42 in FIG. 4, or by the curved surface of a cylinder, like the round edges 38 of chunks 40 in FIG. 3. Large chunks 20 similar to chunks 40 with round edges 38 can tend to trap gas on a lower side, because the local radius of curvature of the chunk is greater than the local radius of curvature of the crucible bottom 24. The chunk therefore poorly conforms to the bottom 24, and tends to engage the bottom at two spaced locations while forming a gap between the chunk and the bottom in between the spaced locations. In contrast, blunt-pointed chunks similar to chunks 42 avoid large flat surfaces on the blunt-point side of the chunk that could trap gas. Blunt-pointed chunks cover less area of the crucible bottom 24 than round-edged chunks, and they better conform locally to the curved contour of the bottom of the crucible 14.

As seen in FIG. 2, those large chunks 20 in the region lining the bottom 24 and side walls 22 are further subdivided into an inner, center region having a generally circular shape of diameter 44 and an outer region. The large chunks 20 in the center region are placed with their longitudinal axis in a generally vertical orientation with their blunted points 36 down. The orientation precludes any trapping of gas pockets beneath the chunk as melting progresses, while avoiding damage to crucible walls. The blunt points 36 cover a substantially smaller portion of the crucible wall along the bottom 24 than the randomly shaped edges of the large chunks 20 of the prior art in FIG. 1, so that there is decreased area for gas bubbles. The blunt points 36 better conform to the wall at a point of contact without causing damage than edges of other shapes. The center region in which large chunks 20 are oriented blunt point down extends in a circle having the diameter 44 being about 1.5 times the diameter of the crystal ingot being produced (i.e. for a 200 mm diameter crystal, large chunks are oriented point down within about a 300 mm diameter central region). Convection currents are created within the source melt as a result of both the rotation of the crucible 14 and temperature gradients, and these currents favorably serve to agitate and mix the source melt. It has been seen in practice that convection currents outside of the center region are considerably stronger than currents within it. Gas pockets which are trapped beneath large chunks outside of the center region often become caught within the currents and are expelled from the melt. Because convection currents are weaker in the center region, chunks located there are oriented vertically to avoid the initial formation of gas pockets.

When chunks 12 are placed within the crucible 14, care is taken to ensure any impact damage or scratching of the quartz walls is avoided by gently laying them in position. All pointed or sharp edges on chunks 12 are carefully placed so as to face away from crucible walls, to prevent scratches as the chunks shift position during meltdown.

Upon completion of the placing of chunks into the crucible, the process continues generally according the Czochralski method of the prior art, whereby the stack 16 is melted in an inert environment to form a source melt, the temperature is stabilized to an equilibrium level suitable for crystal growth, and a single crystal silicon ingot is pulled from the source melt.

Another aspect of the process of the present invention is that the step of melting the stack, at least to the time when melt covers the bottom of the crucible 14, is taken while the crucible has an ambient pressure that is greater than an ambient pressure when the step of stabilizing the temperature is taken. The greater pressure eliminates gas bubbles that may be trapped in the source melt.

Specifically, the step of melt-down is carried out at an ambient pressure about four times that during stabilization. For instance, if the step of temperature stabilization is planned to occur at 20 Torr, then melting is conducted at an ambient pressure of 80 Torr. Any Argon bubbles that become trapped during melting remain at 80 Torr. When ambient pressure above the melt is reduced at the beginning of the temperature stabilization phase, the relatively higher pressure of the trapped bubbles creates an impetus to expand in volume. Larger bubbles are more unstable and have greater buoyancy; therefore they are more likely to collapse or overcome viscous forces in the melt and rise to the surface for expulsion from the melt.

In view of the above, it will be seen that the several objects of the invention are achieved and other advantageous results obtained.

As various changes could be made in the above without departing from the scope of the invention, it is intended that all matter contained in the above description and shown in the accompanying drawings shall be interpreted as illustrative and not in a limiting sense.

What is claimed is:

1. An improved process for forming a single crystal silicon ingot from solid, varying sized chunks of polycrystalline silicon source material according to the Czochralski method, comprising:

classifying each chunk of source material by size;

placing chunks of source material into a crucible to form a stack in the crucible, the chunks generally being placed within at least three regions of the crucible according to both the size classifications of the chunks and a classification according to shape of edges of the chunks;

melting the stack within the crucible in an inert environment at an elevated temperature to form a source melt;

stabilizing the temperature of the crucible and the source melt to an equilibrium level suitable for crystal growth; and pulling the single crystal silicon ingot from the source melt according to the Czochralski method.

2. A process as set forth in claim 1 wherein the step of classifying each chunk of source material by size further comprises discarding the smallest chunks, and separating remaining chunks into three groups of small, medium, and large chunks.

3. A process as set forth in claim 2 wherein the chunks discarded have a size less than about 6 mm in largest dimension.

4. A process as set forth in claim 3 wherein the small chunks are characterized by ranging from approximately 6 to 50 mm in largest dimension, medium chunks from 50 to 88 mm in largest dimension, and large chunks from 88 to 125 mm in largest dimension.

5. A process as set forth in claim 1 wherein the step of melting the stack is taken while the crucible has an ambient pressure that is greater than an ambient pressure when the step of stabilizing the temperature is taken.

6. An improved process for forming a single crystal silicon ingot from solid, varying sized chunks of polycrystalline silicon source material according to the Czochralski method, comprising:

classifying each chunk of source material by size;

placing chunks of source material into a crucible to form a stack in the crucible, the chunks generally being placed within at least three regions of the crucible according to the size classifications of the chunks, and situating at least some of the chunks in orientations relative to the crucible that are based upon shapes of the chunks;

melting the stack within the crucible in an inert environment at an elevated temperature to form a source melt;

stabilizing the temperature of the crucible and the source melt to an equilibrium level suitable for crystal growth; and pulling the single crystal silicon ingot from the source melt according to the Czochralski method.

7. A process as set forth in claim 6 wherein the step of placing chunks of source material into the crucible further comprises situating the chunks along a bottom of the crucible in an orientation with a blunt point of any chunk facing downwardly, and situating the chunks along sides of the crucible in an orientation with pointed edges of any chunk facing away from the sides.

8. A process as set forth in claim 7 wherein the chunks along the bottom of the crucible in a center region of the bottom are oriented such that their longitudinal axes are disposed generally vertically.

9. A process set forth in claim 8 wherein the center region of the bottom is generally circular with a diameter about 1.5 times the diameter of the single crystal ingot.

10. An improved process for forming a single crystal silicon ingot from solid, varying sized chunks of polycrystalline silicon source material according to the Czochralski method, comprising:

classifying each chunk of source material by size;

discarding the smallest chunks, and separating remaining chunks into three groups of small, medium, and large chunks;

placing chunks of source material into a crucible to form a stack in the crucible, the chunks generally being placed within at least three regions of the crucible according to the size classifications of the chunks, including placing large chunks within a region generally along a bottom and sides of the crucible, small chunks within a region generally in a middle portion of the crucible above the large chunks along the bottom, and medium chunks within a region generally in the middle portion of the crucible above the small chunks;

melting the stack within the crucible in an inert environment at an elevated temperature to form a source melt;

stabilizing the temperature of the crucible and the source melt to an equilibrium level suitable for crystal growth; and pulling the single crystal silicon ingot from the source melt according to the Czochralski method.

11. A process as set forth in claim 10 wherein the step of placing chunks of source material into the crucible is further characterized by placing at least some chunks within regions of the crucible according to both the size classifications of the chunks and a classification according to shape of edges of the chunks, said step further comprising placing large chunks having generally blunt points along the bottom of the crucible, and large chunks having generally round edges along the sides of the crucible, blunt points being generally characterized as truncated triangular prism shapes, and round edges being generally cylindrically curved shapes.

12. An improved process for forming a single crystal silicon ingot from solid, varying sized chunks of polycrystalline silicon source material according to the Czochralski method, comprising:

classifying each chunk of source material by size;

placing chunks of source material into a crucible to form a stack in the crucible by placing the chunks generally within at least three regions of the crucible according to the size classifications of the chunks and placing at least some chunks within regions of the crucible according to both the size classifications of the chunks and a classification according to shape of edges of the chunks;

melting the stack within the crucible in an inert environment at an elevated temperature to form a source melt;

stabilizing the temperature of the crucible and the source melt to an equilibrium level suitable for crystal growth; and pulling the single crystal silicon ingot from the source melt according to the Czochralski method, wherein the step of melting the stack is taken while the crucible has an ambient pressure that is greater than an ambient pressure when the step of stabilizing the temperature is taken.

13. An improved process for forming a single crystal silicon ingot from solid, varying sized chunks of polycrystalline silicon source material according to the Czochralski method, comprising:

classifying each chunk of source material by size;

placing chunks of source material into a crucible to form a stack in the crucible by placing the chunks generally within at least three regions of the crucible according to the size classifications of the chunks, and situating at least some of the chunks in orientations relative to the crucible that are based upon the shapes of the chunks;

melting the stack within the crucible in an inert environment at an elevated temperature to form a source melt;

stabilizing the temperature of the crucible and the source melt to an equilibrium level suitable for crystal growth; and pulling the single crystal silicon ingot from the source melt according to the Czochralski method, wherein the step of melting the stack is taken while the crucible has an ambient pressure that is greater than an ambient pressure when the step of stabilizing the temperature is taken.

14. A process ass set forth in claim 13 wherein the step of placing chuncks of source material into the crucible further comprises situating the chunks along a bottom of the crucible in an orientation with a blunt of any chunk facing downwardly, and situating the chunks of the crucible in an orientation with pointed edges of any chunk facing away from the sides.

15. An improved process for forming a single crystal silicon ingot from solid, varying sized chunks of polycrystalline silicon source material according to the Czochralski method, comprising:

classifying each chunk of source material by size, discarding the smallest chunks, and separating remaining chunks into three groups of small, medium, and large chunks;

placing chunks of source material into a crucible to form a stack in the crucible by placing the chunks generally within at least three regions of the crucible according to the size classifications of the chunks;

melting the stack within the crucible in an inert environment at an elevated temperature to form a source melt;

stabilizing the temperature of the crucible and the source melt to an equilibrium level suitable for crystal growth; and pulling the single crystal silicon ingot from the source melt according to the Czochralski method, wherein the step of melting the stack is taken while the crucible has an ambient pressure that is greater than an ambient pressure when the step of stabilizing the temperature is taken.

16. A process as set forth in claim 15 wherein the step of placing chunks of source material into the crucible further comprises placing large chunks within a region generally along a bottom and sides of the crucible, small chunks within a region generally in a middle portion of the crucible above the large chunks along the bottom, and medium chunks within a region generally in the middle portion of the crucible above the small chunks.

* * * * *

UNITED STATES PATENT AND TRADEMARK OFFICE
CERTIFICATE OF CORRECTION

PATENT NO. : 6,284,040 B1
DATED : September 4, 2001
INVENTOR(S) : John D. Holder and Hariprasad Sreedharamurthy It is certified that error appears in the above-identified patent and that said Letters Patent is hereby corrected as shown below:

Column 8,
Line 5, please change "process set" to read -- process as set --.
Line 7, please change crystal ingot" to read -- crystal silicon ingot --.

Column 9,
Line 27, please change "blunt of" to read -- blunt point of --.
Line 28, please change "chunks of" to read -- chunks along sides of --.

Signed and Sealed this

Ninth Day of July, 2002

Attest:

JAMES E. ROGAN
Attesting Officer
Director of the United States Patent and Trademark Office